United States Patent [19]
Milberger

[11] Patent Number: 4,570,129
[45] Date of Patent: Feb. 11, 1986

[54] HIGH POWER HIGH VOLTAGE LINEAR AMPLIFIER APPARATUS

[75] Inventor: Walter E. Milberger, Severna Park, Md.

[73] Assignee: The United States of America as represented by the Secretary of the Air Force, Washington, D.C.

[21] Appl. No.: 586,955

[22] Filed: Mar. 7, 1984

[51] Int. Cl.⁴ .............................................. H03F 3/16
[52] U.S. Cl. ..................................... 330/277; 330/296
[58] Field of Search .................... 330/70, 71, 74, 277, 330/296, 297

[56] References Cited

U.S. PATENT DOCUMENTS

| | | | |
|---|---|---|---|
| 2,950,443 | 8/1960 | Davidson et al. | 330/70 |
| 3,286,189 | 11/1966 | Mitchell et al. | 330/18 |
| 3,383,613 | 5/1968 | Novak | 330/22 |
| 3,668,545 | 6/1972 | Von Recklinghausen | 330/207 P |
| 3,953,807 | 4/1976 | Schade | 330/35 |
| 3,968,452 | 7/1976 | Sahara et al. | 330/29 |
| 3,986,132 | 10/1976 | Wittlinger | 330/297 |
| 3,988,691 | 10/1976 | Shih | 330/15 |

*Primary Examiner*—James B. Mullins
*Attorney, Agent, or Firm*—Donald J. Singer; William Stephanishen

[57] ABSTRACT

A high power, high voltage linear field effect transistor amplifier apparatus utilizing an automatic gate biasing network to normalize the gate threshold voltages of a plurality of field effect transistors which are in either series or parallel. Thus, these series or parallel combinations of field effect transistors may be operated as linear devices. A high-voltage, high power, wide-band carrier controlled linear amplifier is provided by utilizing an oscillator as a driver.

5 Claims, 6 Drawing Figures

HIGH POWER HIGH VOLTAGE LINEAR AMPLIFIER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to power amplifiers, and more particularly to a high power high voltage linear simplifier apparatus.

In the prior art, there exists a need for a high-voltage (1–2 kilo-volts) bi-polar amplifier. Presently, neither bi-polar nor field effect transistor complementary transistors are available in this voltage range. As a result of this predicament, the need for a high power, high voltage linear amplifier exists.

The field effect transistor (FET) is a three-terminal device having source, drain and gate electrodes. The source and drain are biased relative to the gate electrode so that the PN junctions between contiguous zones of the semi-conductor are biased in the reverse direction. The potential of the drain, however, is substantially greater than that of the source. The signals to be amplified are applied between the source and gate electrodes, whereby variations in the potential of the gate electrode control the conductivity of the path for the flow of electrical carriers in the intermediate zone from the source to the drain.

The field-effect transistor has an amplification characteristic that is similar to that of a vacuum pentode. It is a voltage controlled device and its input impedance can be very high. In addition, its signal current is composed of carriers of one polarity only a factor which eliminates many of the noise sources associated with conventional transistors. These characteristics of the field-effect transistor provide a highly desirable device for use in amplifiers that can operate from high impedance sources, such as the piezoelectric transducer of hydrophone, or with other medium-to-high impedance sources where outstanding noise performance is required.

SUMMARY OF THE INVENTION

The present invention utilizes the linear operation of field effect transistors in either series and/or parallel combinations, with equal current and voltage sharing over a dynamic range extending from the gate threshold voltage up to the drain to source saturation limit of the field effect transistor. A gate threshold biasing circuit automatically biases as the field effect transistors to normalize their gate threshold voltages. The automatic bias circuit utilizes a transistor control circuit connected to the gate of the field effect transistor to maintain the threshold voltage during the dynamic periods of the field effect transistor, and diodes to limit the voltage drop across the emitter-base junctions during signal conditions.

It is one object of the present invention, therefore, to provide an improved high power, high voltage linear amplifier apparatus.

It is another object of the invention to provide an improved high power, high voltage linear amplifier apparatus to normalize the gate threshold voltage of field effect transistors whose initial values vary over a decade.

It is another object of the invention to provide an improved high power, high voltage linear amplifier apparatus to provide de-generation proportionate to signal level over a wide temperature range.

It is another object of the invention to provide an improved high power, high voltage linear amplifier apparatus utilizing a wide-band carrier controlled modulation technique which permits both high voltage isolation and a multi-port distribution fan out for series and/or parallel operation of field effect transistors.

These and other advantages, objects and features of the invention will become more apparent after considering the following description taken in conjunction with the illustrative embodiment in the accompanying drawings.

DESCRIPTION OF THE PREFERRED EMBODIMENT

Figure 1A:
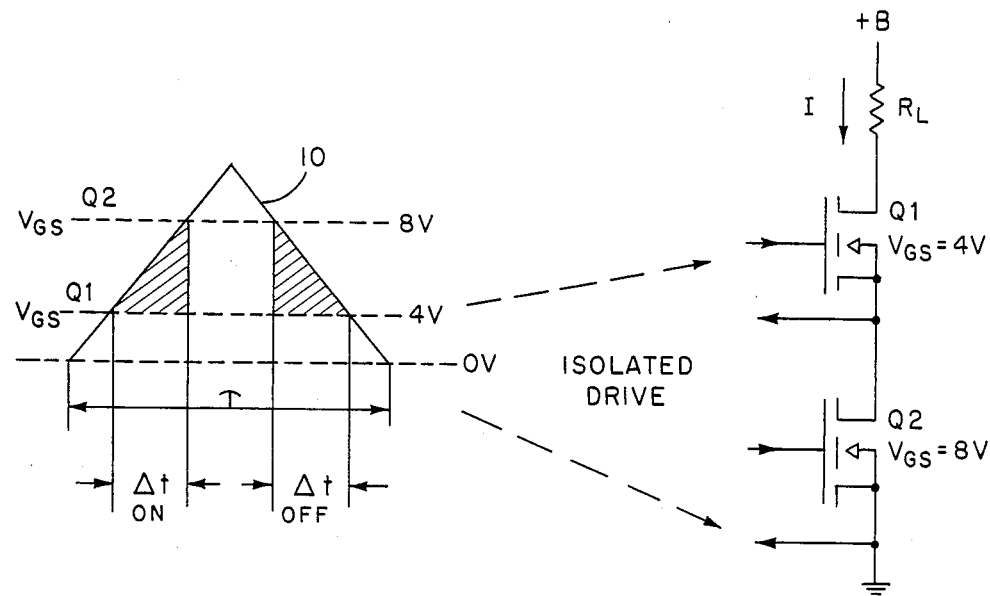
FIGS. 1a and 1b are schematic diagrams respectively of the series and parallel operation of a pair of field effect transistors.

Referring now to FIG. 1a, there is shown a pair of field effect transistors Q1, Q2 which are connected in series wherein the source of transistor Q1 is connected to the drain of transistor Q2. The gate voltage $V_{GS}$ as shown in the graphical representation of the input signal 10 is respectively received at the gates of transistors Q1, Q2. The gate threshold voltage of enhancement mode field effect transistors vary within the range of one to eight volts between similiar devices. Such variences may cause disproportionate voltage or current distribution within devices that are operated in either a series or a parallel combination. If transistors Q1 and Q2 have respective gate threshold voltages of 4 and 8 volts, the application of gate signal EG, would cause transistor Q1 to conduct a predetermined ($dt_{on}$ plus $dt_{off}$) time longer than transistor Q2. During either of these (dt) transition times, transistor Q2 must sustain the full drain to source supply voltage when the two devices are operated in series. If the supply voltage exceeds the device ($VE_{DSS}$) rating, transistor Q2 will go into first avalanche conduction until such time that its gate threshold voltage is approached. If the avalanche conduction period times (peak current) time (duty cycle) exceeds the device dissipation, failure will ultimately occur.

Figure 1B:
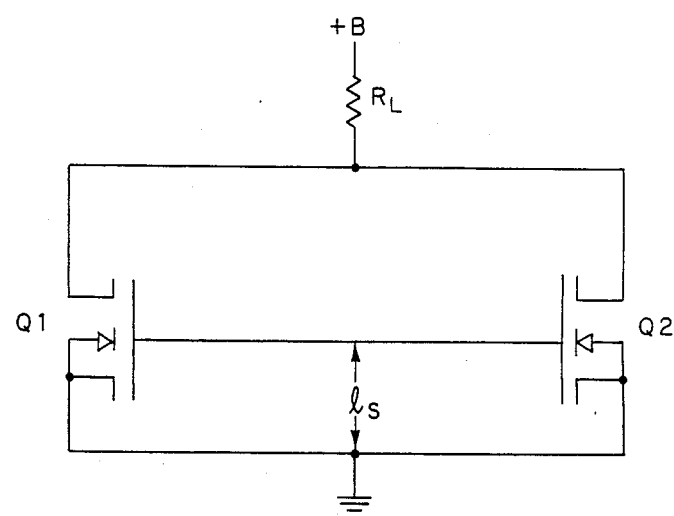

In FIG. 1B there is shown a pair of field effect transistors Q1, Q2, which are arranged in a parallel circuit configuration wherein the respective sources, gates and drains of transistors Q1, Q2 are connected. When the signal 10 of FIG. 1A is applied, a first avalanche condition will not occur in field effect transistors Q1, Q2, but rather only an inequity of device current sharing will prevail. Transistor Q1 must provide full load current until the eight volt gate threshold voltage of transistor Q2 is reached.

Thus, it may be seen that, in either a series or parallel operation of field effect transistors, an unmatched gate threshold voltages condition will occur which is not feasible for d.c. or low frequency application. One technique to minimize gate threshold voltage variations is to select the transistors. One alternative is to adjust each gate voltage by means of diode or zener biasing networks. Both of these methods become impractical when field replacement and production requirements are imposed. Since the floating signal feed which is required by series operated field effect transistors is more complex than that of parallel operated field effect transistors, only the series configuration will be discussed hereafter.

Figure 2:
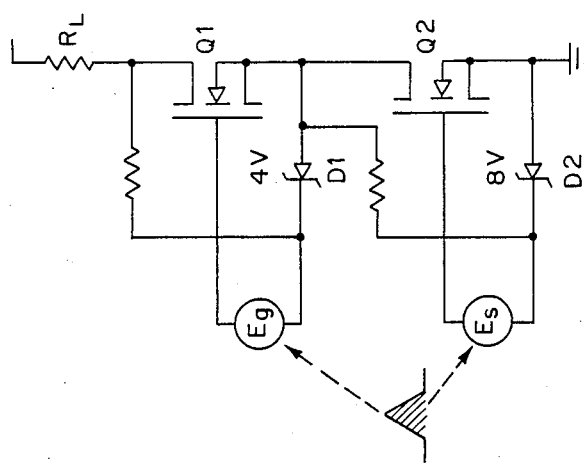
FIG. 2 is a schematic diagram of the zener diode bias method for field effect transistors.

In FIG. 2 there is shown one of the alternate methods of adjusting the individual gate bias by selecting zeners diodes D1, D2 to correspond to the respective gate threshold voltages of the field effect transistor pair. However, when such a scheme is attempted for ten or more series devices, this technique becomes impractical from a production point of view.

Figure 3:
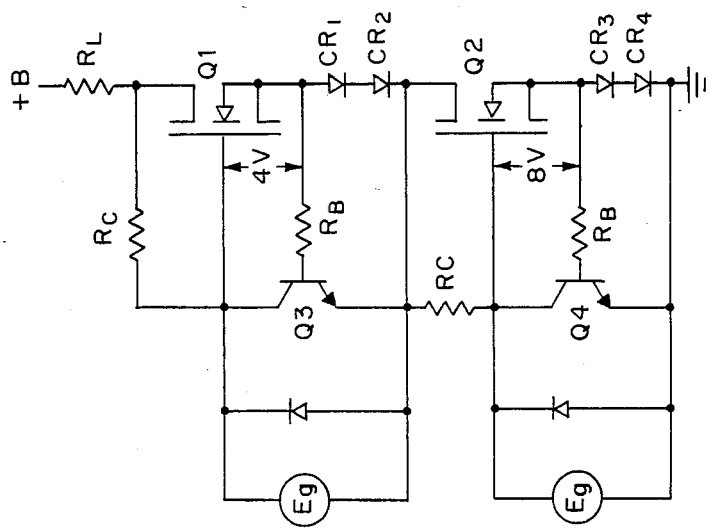
FIG. 3 is a schematic diagram of an automatic biasing circuit for field effect transistors in series.

Turning now to FIG. 3, there is shown an active biasing method which provides a practical alternative to the hit and miss manual approximation method. In its simplest form, biasing is achieved by applying the supply voltage to the gates of transistors Q1 and Q2. This causes transistors Q3 and Q4 to turn on. This state is maintained until such time that gate threshold voltages of field effect transistors Q1 and Q2 are reached. At this time, a state of equilibrium is established in each bias loop. This condition maintains a constant current which is set by the base feed resistors $R_B$ of transistors Q3 and Q4. Typically, this constant current is between 100 micro-amperes to one milli-ampere. Diodes CR1, CR2, CR3, and CR4 are included to limit the voltage drop respectively across the base to emitter junctions of transistors Q3 and Q4 during signal conditions. Upon the application of the signal, Eg, both field effect transistors Q1 and Q2 will assume conduction at their threshold voltages. Assuming that the gain of each stage is identical, all stages will contribute equally to the overall gain of the composite amplifier. Unfortunately, two factors prevent this condition to exist. The first condition is that the stage gains will not be exactly the same because of transconductances gm variations. The second condition is that the quiescent threshold biases which is set by transistors Q3 and Q4 will deteriorate under dynamic conditions. In case number two, the bias shift arises when the voltage drop across the field effect transistor source diode pairs CR1, CR2 and CR3, CR4 increases beyond that required to maintain the respective gate threshold biases of field effect transistors Q1 and Q2 in the quiescent condition. In order to circumvent this condition, it is necessary to box-car or store and maintain the quiescent bias information acquired during the self-bias sampling period.

Figure 4:
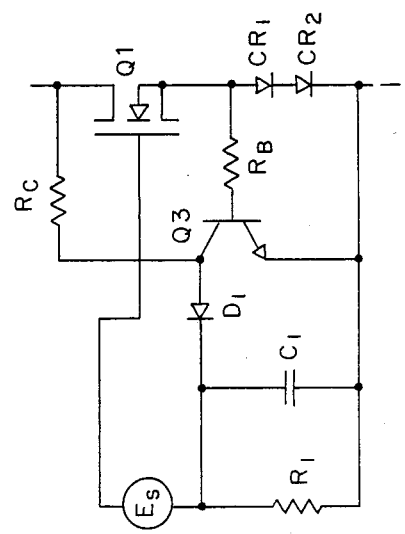
FIG. 4 is a schematic diagram of a box car biasing circuit for field effect transistors, and, FIG. 5 is a schematic diagram of a high power, high voltage, linear amplifier apparatus.

In FIG. 4 there is shown a simple analog method of accomplishing this requirement. In this configuration, the bias gate voltage is stored in capacitor C1. Now when the collector of transistor Q3 goes more negative than the quiescent bias set on capacitor C1, the diode D1 prevents the discharge of the stored information and; thereby maintains the gate threshold voltage on field effect transistor Q1 throughout the dynamic period. If, however, the dynamic period exceeds the R-C time constant of the capacitor C1 and the resistor R1 by many seconds, it will become necessary to interrupt the dynamic mode momentarily (micro-seconds) in order to re-establish the quiescent bias set point. In all video applications this is of no consequence since reset will automatically occur. The same action is required for bi-polar signal operation. The only time that this momentarily interrupt may become a problem is when purely d.c. operation is required. In that case, it becomes necessary to remove the signal source momentarily every few seconds to allow the bias voltage to reset. However, this presents no major consequence since most d.c. amplifiers have some passivity storage element at their output. The alternative to this analog scheme is to provide a digital store to maintain the bias set point for d.c. operation. The complexity of such an approach is highly impractical in the multi-stage design.

With respect to FIG. 3 it should be noted that the purpose of the field effect transistor source diodes CR1, CR2, CR3, and CR4 is to provide a voltage drop large enough to permit transistors Q3 and Q4 to conduct (600 to 700 milli-volts) in the quiescent state, while providing a low impedance path in the dynamic state. The dynamic impedance may be reduced even further by bypassing the diodes. A variety of other schemes can be used to establish this potential gradient, such as zeners, hall effect devices, and/or biased transistors or similiar devices may be utilized. If high speed diodes are used, the automatic gain control and temperature stabilization of each series amplifier stage may be achieved as a by-product. The intrinsic negative temperature coefficient and the impedance characteristics of the diodes will automatically provide the means of accomplishing these additional benefits. Since the impedance of diodes vary almost linearly with respect to the inverse of the current flowing through the device, the gain variations from stage to stage are normalized over an extensive dynamic range by the degeneration which is introduced by the diodes. In addition, since the temperature coefficient of the diodes is negative, and the temperature coefficient of the field effect transistors is positive, almost uniform gain compensation of the composite amplifier is stabilized over a wide temperature range. While various means of normalizing the gate threshold voltage and the gain variations that occur from stage to stage have been discussed, the best method of implementing the composite series stacked field effect transistors linear amplifier must be considered. Since each amplifier stage which is operated in a series combination is at a different d.c. potential, it is necessary to provide isolated gate drives to each stage. The signal which is applied to each stage must be identical and monotonic in form in order to avoid the complicated minor feed-back loops for each stage. Moreover, the coupling method must be completely isolated from ground in both the d.c. and dynamic state. Large capacitances to ground, for example, would cause the series string to appear as a low-pass filter, which would restrict the bandwidth and cause equitable voltage distribution under dynamic conditions. Three coupling methods that are likely candidates are: (1) transformer coupling, (2) light emitter diode coupling, and (3) hall effect magnetic coupling. All three couping methods could be designed to stand off ten's of thousands of volts at acceptable floating deck to ground capacitance values. Both the light and magnetic coupling methods have the disadvantage in that a separate coupling device must be employed for each floating amplifier stage. Other than the cost and complexity involved, this is not an acceptable method unless exact signal tracking from stage to stage can be assured. At this time, batch to batch production characteristics of either type of device does not provide this guarantee. With the introduction of glass coaxial distribution transformers, voltage gradients in excess of 100,000 voltages can be accommodated. Given a common primary (ground deck) drive. All of the isolated secondary distribution port signals will track the primary signal in congruous form. Although the spirit of this invention does not exclude other coupling means, the transformer method will be used to present the unique amplifier design herein related.

Figure 5:
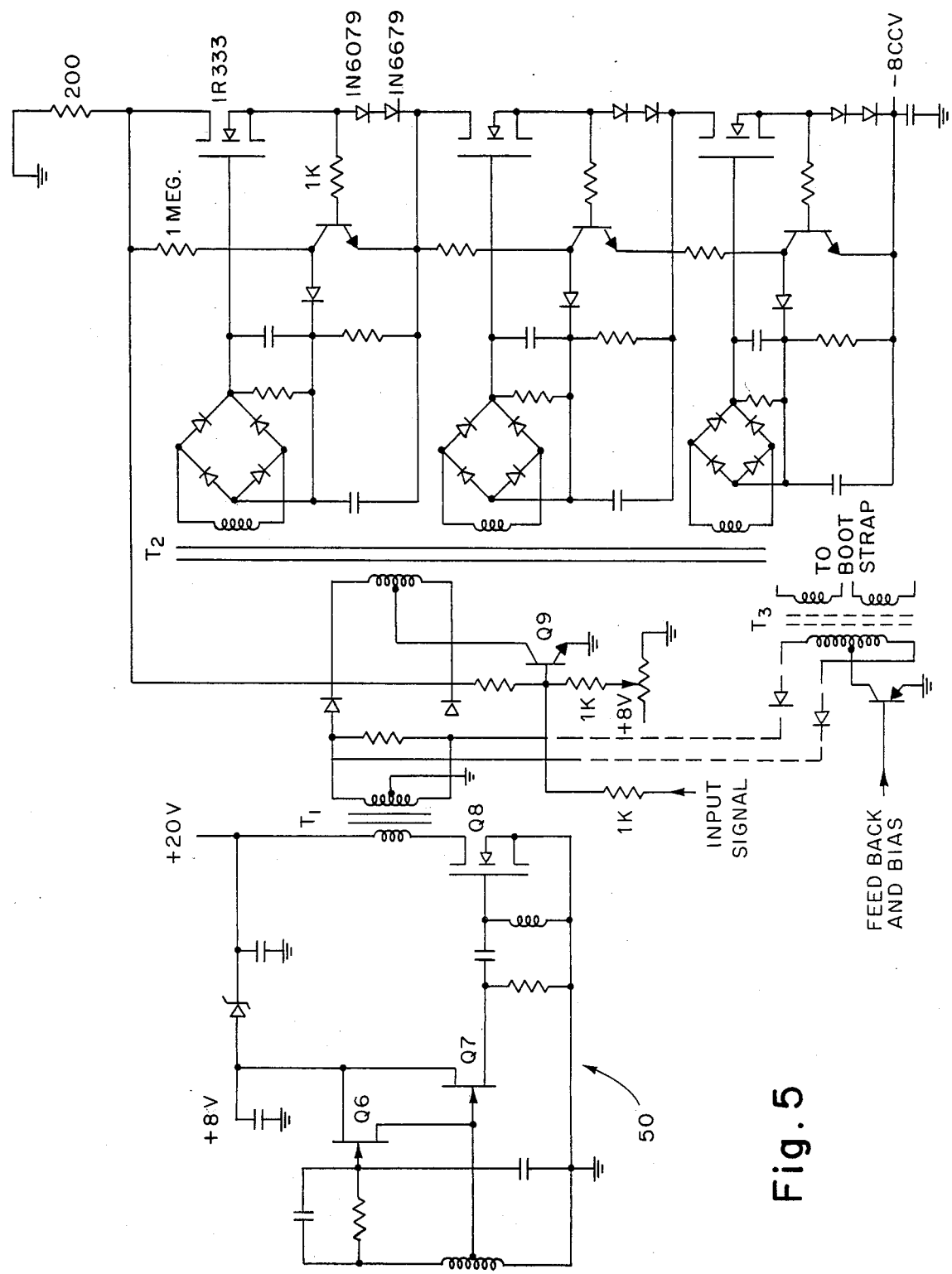

Turning now to FIG. 5 there is shown a high voltage, high power linear amplifier utilizing oscillator unit 50. The oscillator 50 which is comprised of J-field effect transistors Q6 and Q7, in combination with associated L-C components, generates a 50 MHz carrier which drives the gate of field effect transistor Q8. The output of amplifier stage Q8 is diode gated from the secondary of transformer T1 to primary of transformer T2. Since the center tap of transformer T1 is grounded, a signal proportionate to the conduction level of control amplifier Q9 is developed across all secondaries of transformer T2. This coupling method permits each rectified secondary signal to appear as a control voltage superimposed on the gate threshold bias voltage of each series operated field effect transistor. Aside from minor discrepancies involving the contact potential and dynamic impedance variations of the quadurature rectifiers, all series operated field effect transistors are driven by identical signals over a dynamic range extending from their normalized gate threshold bias points to their saturation limits. As mentioned earlier, variations which are attributed to transconductance or gain are normalized by degeneration that is introduced by the field effect transistor source diodes over a full temperature range. This configuration approximates a three terminal network which can provide either an amplifier and/or a switching function up to tens of kilo-volts and tens of amperes.

The bandwidth of the composite amplifier is limited to the R-C time constant set by the network appearing across the output of the field effect transistor gate drive rectifiers. Since the 100 Mhz rectified ripple frequency is beyond in the cut-off frequency of power field effect transistors extensive filtering is not required. The network selected uses a 100 ohm resistor to discharge the 1,000 pf gate capacitance for negative going signals. This is related to a fall time of 220 nanoseconds of a bandwidth of 1.6 MHz. At the sacrifice of increased carrier power, this time constant can be reduced much further. The apparatus shown in FIG. 5 was operated at 800 volts at a peak current of four amperes. The open-loop gain was used to share the 800 volt supply. Series field effect transistors have been operated up to 10 KV as single pole switches, so there should be no problem of extending the video amplifier mode to that voltage swing. To implement a bi-polar amplifier, it is necessary to provide a negative diode gated carrier to transforxer T3 (shown in dashed circuit). The center tap of transformer T3 would be controlled by a P-channel field effect transistor or a PNP bi-polar transistor. This complement branch would drive three series connected field effect transistors from the secondary windings of transformer T3. In this case, the output devices would be operated as boot strap amplifiers rather than inverting amplifiers.

Although the invention has been described with reference to a particular embodiment, it will be understood to those skilled in the art that the invention is capable of a variety of alternative embodiments within the spirit and scope of the appended claims.

What is claimed is:

1. A high power, high voltage linear field effect transistor amplifier apparatus comprising in combination:
   a plurality of field effect transistors connected in series between a +B voltage source and ground, the drain of the first field effect transistor connected to said +B voltage source, the source of the last field effect transistor connected to ground,
   a diode pair connected respectively between the source and the drain of adjacent series field effect transistors of said plurality of field effect transistors,
   a gate biasing network connected respectively between the gate and source of each field effect transistor of said plurality of field effect transistors, said gate biasing network maintaining the gate threshold voltage of each field effect transistor, and,
   an input signal source connected respectively to between the gate and source of each field effect transistor of said plurality of field effect transistors.

2. A high power, high voltage linear field effect transistor amplifier apparatus as described in claim 1 further including a storing means to store a quiescent bias level, said storing means connected respectively between said input signal source and said source of each field effect transistor of said plurality of field effect transistors.

3. A high power, high voltage linear field effect transistor amplifier apparatus as described in claim 2 further including an oscillator means to provide a predetermined frequency signal, and a control amplifier means to receive said predetermined frequency signal, said control amplifier means isolating said oscillator means from said gates of said plurality of field effect transistors, said control amplifier means applying said predetermined frequency signal to said gates of said plurality of field effect transistors.

4. A high power, high voltage linear field effect transistor amplifier apparatus as described in claim 3 wherein said predetermined frequency signal comprises 50 MHz.

5. A high power, high voltage linear field effect transistor amplifier apparatus as described in claim 1 wherein said gate biasing network comprises an NPN transistor having an emitter, base and collector, each collector of said biasing network respectively connected by a resistive means to the drain of its corresponding field effect transistor, said base of said biasing network respectively connected to the source of its correponding field effect transistor, said emitter connected between said diode pair and input signal source of its corresponding field effect transistor.

* * * * *